(12) United States Patent
Abrams et al.

(10) Patent No.: US 7,076,124 B2
(45) Date of Patent: Jul. 11, 2006

(54) INTEGRATED MULTICHANNEL LASER DRIVER AND PHOTODETECTOR RECEIVER

(75) Inventors: Matthew Scott Abrams, San Jose, CA (US); Young Gon Kim, San Jose, CA (US); Myunghee Lee, San Jose, CA (US); Stefano Therisod, Sunnyvale, CA (US); Robert Elsheimer, Fort Collins, CO (US)

(73) Assignee: Avago Technologies, Ltd., Denver, CO (US)

( * ) Notice: Subject to any disclaimer, the term of this patent is extended or adjusted under 35 U.S.C. 154(b) by 299 days.

(21) Appl. No.: 10/327,216

(22) Filed: Dec. 20, 2002

(65) Prior Publication Data

US 2004/0120630 A1 Jun. 24, 2004

(51) Int. Cl.
*G02B 6/12* (2006.01)
(52) U.S. Cl. .......................... 385/14; 257/458; 257/371
(58) Field of Classification Search ................ 257/458, 257/371; 385/14
See application file for complete search history.

(56) References Cited

U.S. PATENT DOCUMENTS 3,881,113 A * 4/1975 Rideout et al. .............. 250/551
4,240,087 A * 12/1980 Krause et al. ................ 257/82
5,747,864 A * 5/1998 Kitatani et al. ............. 257/458

OTHER PUBLICATIONS

Takeshi Nagahori et al., ISSCC 2001/Session 14/Gigabit Communications 11/14.3, A Si Bipolar Laser Diode Driver/Receiver Chip Set for 4-Channel 5Gb/s Parallel Optical Interconnection.

* cited by examiner

*Primary Examiner*—Frank G. Font
*Assistant Examiner*—Eric Wong
(74) *Attorney, Agent, or Firm*—Kevin D. Jablonski

(57) ABSTRACT

An integrated circuit cast on a single die having a plurality of receivers in a receiver region, a plurality of transmitters in a transmitter region, and a spatial separation region having a plurality of n-type and p-type subregions disposed on the single die to separate the transmitter region from the receiver region. The pn-junctions between the n-type and p-type subregions are reverse-biased thereby reducing or eliminating coupling of noise and crosstalk between the transmitter and receiver is reduced.

33 Claims, 4 Drawing Sheets

US 7,076,124 B2

INTEGRATED MULTICHANNEL LASER DRIVER AND PHOTODETECTOR RECEIVER

BACKGROUND OF THE INVENTION

Fiber-optic communication devices typically use a transmit channel and a receive channel to allow communications with many of today's computer and electronic systems. The use of integrated circuits has allowed communication devices to be manufactured in smaller and smaller modules. Generally speaking, integrated circuits are very susceptible to electromagnetic noise and will not function properly if a large amount of noise is present near the integrated circuit. This is particularly noticeable in an integrated circuit with a receive channel. As such, care must be taken to ensure noise will not interfere with a fiber-optic communication module having both a transmitter and a receiver (transceiver).

In the past, a manufacturer, in order to ensure proper operation, designed a transceiver with two separate integrated circuit chips in the module. One integrated circuit was designed for the transmitter and one integrated circuit was designed for the receiver. Furthermore, each integrated circuit could be designed to have more than one transmitter or receiver on the chip, i.e., a multichannel device. Particularly problematic, however, was designing an integrated circuit with both a transmit channel and a receive channel on the same integrated circuit, i.e. a single die.

The common perception of the past was that a transmitter was too noisy to be included on the same integrated circuit as a noise-sensitive receiver. Consequently, most transceiver modules are able to accomplish an acceptable level of operation with only a transmitter and a receiver on two physically separate integrated circuits. An example of such a multichannel device is described in detail in *A Si Bipolar Laser Diode Driver/Receiver Chip Set for 4-channel 5 Gb/s Parallel Optical Interconnection*, Nagahori et al., ISSCC, Gigabit Optical Communications II Conference Journal, February 2001.

Furthermore, digital circuitry, such as clocked logic circuitry, was typically omitted from receiver circuits because as stated above receiver circuits are very sensitive to noise. Therefore, standalone receiver chips typically didn't have the functionality that digital circuitry offers.

SUMMARY OF THE INVENTION

An embodiment of the invention is directed to an integrated circuit cast on a single die having a plurality of receivers in a receiver region, a plurality of transmitters in a transmitter region, and a spatial separation region having a plurality of alternating n-type semiconductor and p-type semiconductor subregions disposed on the single die to separate the transmitter region from the receiver region. The n-type and p-type subregions are reverse biased by a voltage source or a ground such that the noise generated by components in the transmitter region is reduced or eliminated in the receiver region.

In another embodiment, voltage sources or grounds supplying respective components in the transmitter region are separate and distinct from voltage sources or grounds supplying components in the receiver region. Further, amplifying and buffering components in the transmitter region have a separate and distinct voltage source and ground from the output driving components in the transmitter region. Likewise, amplifying components in the receiver region have a separate and distinct voltage source and ground from the output driving components in the receiver region. Such isolated voltage sources and grounds further reduce the effects of noise and crosstalk in an integrated circuit having transceiver capability.

Additionally, because extensive steps are taken to reduce noise and crosstalk, digital features normally too noisy for use with sensitive receiver circuits can now be used. This allows for additional enhancements because the receiver circuitry can connect directly to on-chip digital circuitry without having to go off the integrated circuit.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

Figure 1:
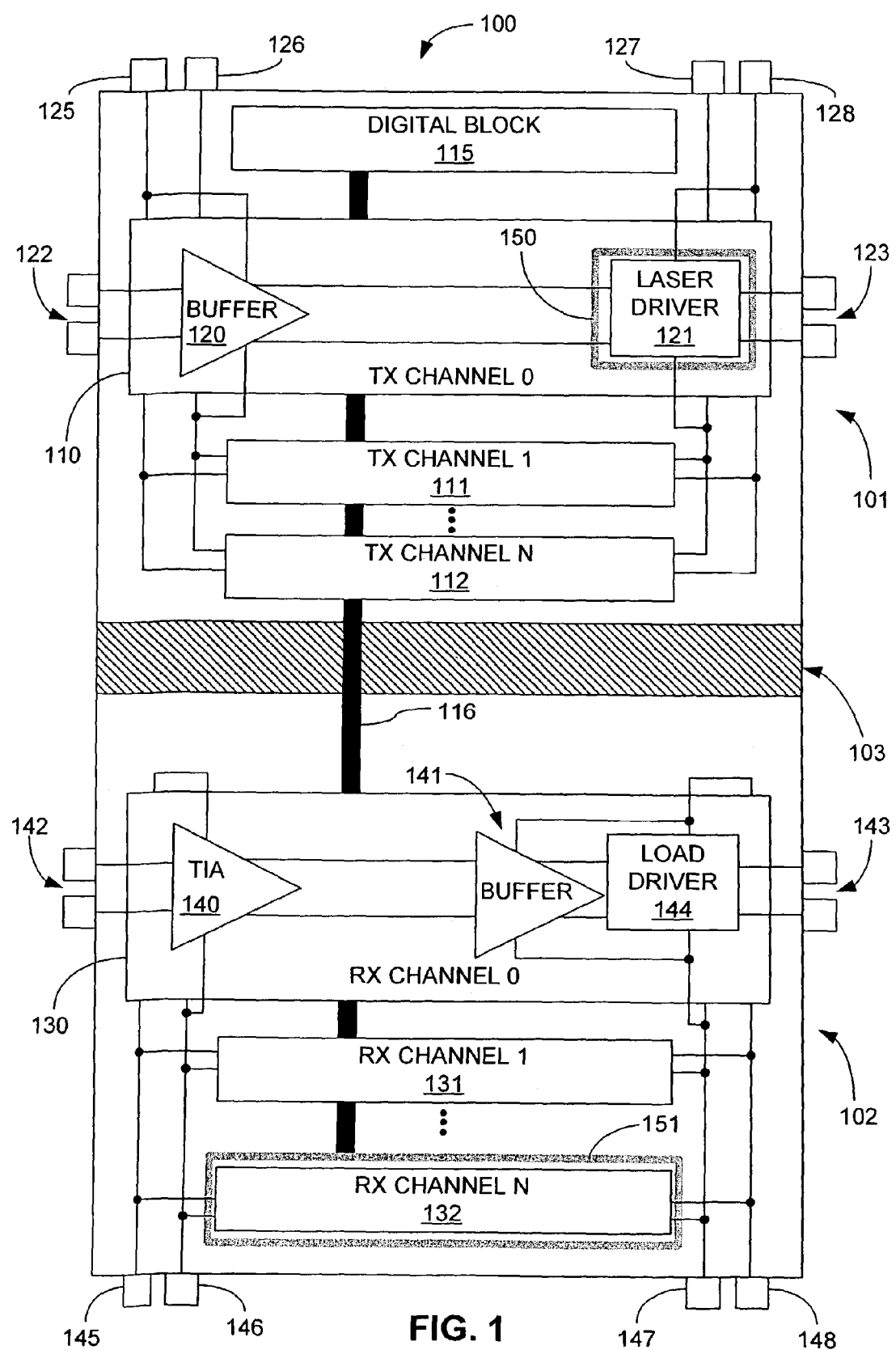
FIG. 1 is a block diagram of an integrated circuit having a plurality of transmitters and a plurality of receivers in accordance with an embodiment of the invention.
Figure 2:
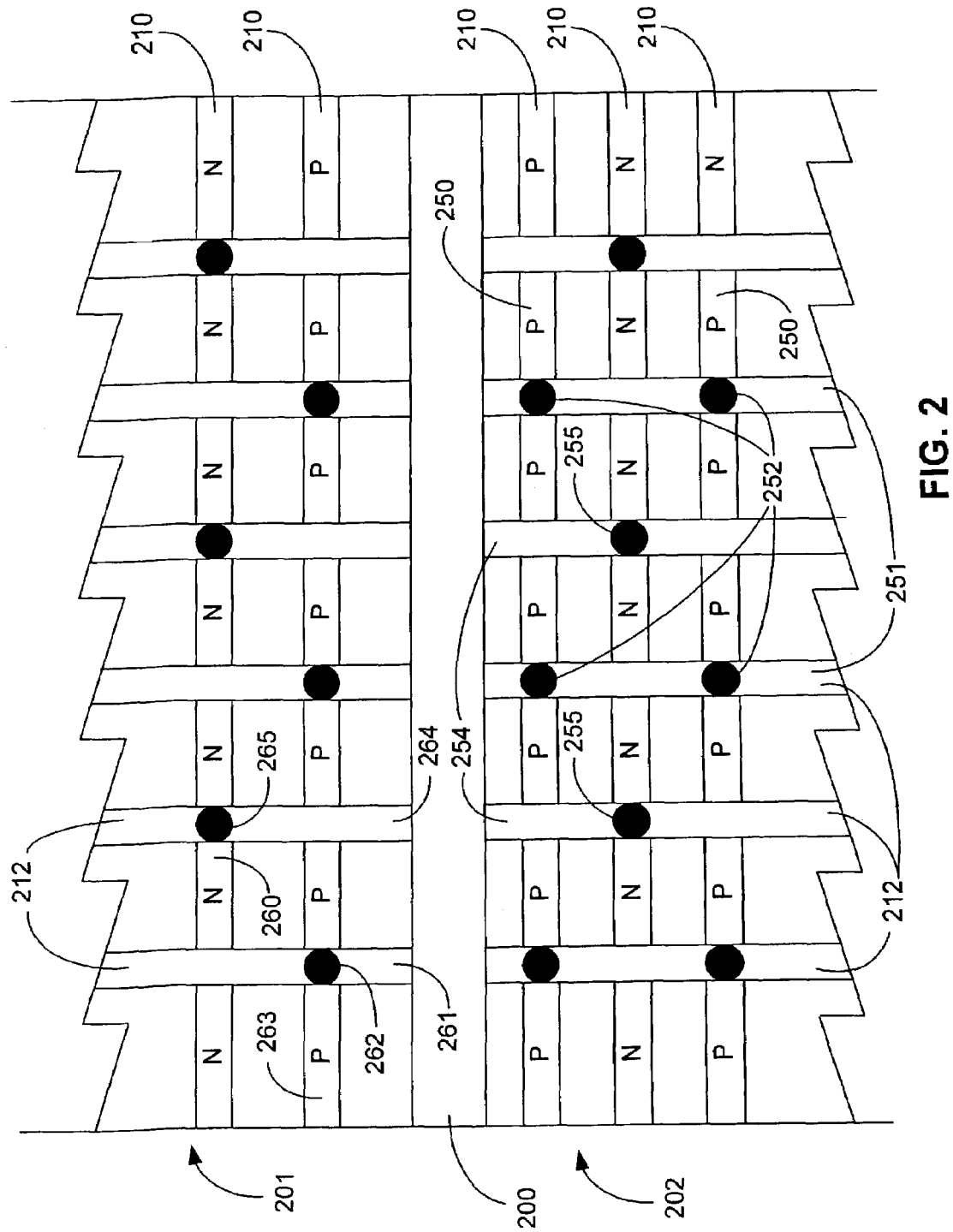
FIG. 2 is a graphical depiction of the spatial separation region of the integrated circuit of FIG. 1 in accordance with an embodiment of the invention.

With reference to FIG. 1, a block diagram of an integrated circuit 100 in accordance with an embodiment of the invention is presented. The integrated circuit 100 comprises a plurality of transmit channels 110, 111 and 112 disposed in a transmit region 101 and a plurality of receive channels 130, 131 and 132 disposed in a receive region 102. Both regions 101 and 102 are disposed on a single die, i.e. only one microchip. Additionally, the integrated circuit also comprises a spatial separation region 103, which is also disposed on the same die and physically separates the transmit region 101 from the receive region 102. The spatial separation region 103 is designed to significantly reduce electromagnetic interference problems such as noise and crosstalk that are generated from one region and have detrimental effects on the other region. The spatial separation region 103 is described in greater detail below with respect to FIG. 2. The arrangement of blocks in FIG. 1 is for illustrative purposes alone and does not necessarily reflect the actual layout of the integrated circuit 100.

The transmit region 101 comprises a plurality of transmit channels 110, 111, and 112 and a digital logic block 115. The digital logic block 115, which communicates with the transmit and receive channels via an 8-bit digital bus 116, provides digital circuitry for the operation of the integrated circuit 100 and will be described in greater detail below. The number of transmit channels may vary between 1 and N and in one embodiment the number of transmit channels is four. For the ease of illustration, only the "0" transmit channel 110 is shown in detail. However, the following discussion applies to each transmit channel 110, 111, and 112.

A typical transmit channel 110 comprises two stages, an input stage 120 and a drive stage 121. An input signal, generated off chip, enters the transmit channel 110 at a pair of high-speed differential input pads 122. The input stage 120 comprises analog circuitry for processing the input signal so that it is suitable to be connected to the drive stage 121. Such processing includes buffering the drive stage from a range of signal input amplitudes and rise/fall times to attain a cleaner signal for driving. Additional processing may be performed but is not described herein. Once the input signal is processed, the drive stage 121 drives an off chip laser by converting the differential voltage input signal into an electrical current that drives the laser. The laser is typically an industry-standard VCSEL (Vertical Cavity Surface Emitting Laser) and receives the VCSEL driver analog current output signal through a pair of output pads 123

To further reduce noise and crosstalk in the integrated circuit 100, the input stage 120 and the drive stage 121 are powered from two distinct voltage sources and grounds. The input stage 120 of each transmit channel is driven from a first off chip voltage source and ground that is coupled to the integrated circuit 100 via $VDD_{TA}$ 125 and $GND_{TA}$ 126. Likewise, the drive stage 121 of each transmit channel is driven from a second off chip voltage source and ground that is coupled to the integrated circuit 100 via $VDD_{TB}$ 127 and $GND_{TB}$ 128. Each voltage source is typically 3.3 Volts nominal. Therefore, as can be seen in FIG. 1, there are two separate power and ground pads and traces in the transmit region 101 on each side of the block diagram.

Still referring to FIG. 1, the receive region 102 comprises a plurality of receive channels 130, 131, and 132. The number of receive channels may also vary between 1 and N and in one embodiment the number of receive channels is four, which is equal to the number of transmit channels. For the ease of illustration, again only the "0" receive channel 130 is shown in greater detail, however, the following discussion applies to each receive channel 130, 131, and 132.

A typical receive channel 130 also has two stages, a pre-amplifier stage 140 and a post-amplifier/output stage 141. An input signal, generated off-chip by a photodiode or other similar device operable to convert optical pulses into an electrical signal, enters the receive channel 130 at anode/cathode input pads 142. The pre-amplifier stage 140 comprises analog circuitry for processing the input signal so that it is suitable to be coupled to the post-amplifier/output stage 141. Such processing includes conversion of the photocurrent to a differential voltage and amplification to drive the post-amplifier/output stage 141. Additional processing may be performed but is not described herein. Once the input signal is processed, the post-amplifier/output stage 141 further buffers the signal to further clean up the signal for driving an external electrical load that is coupled to the integrated circuit 100 at a differential pair of output pads 143.

Again, to further reduce noise and crosstalk in the integrated circuit 100, the pre-amplifier stage 140 and a post-amplifier/output stage 141 are powered from two distinct voltage sources and grounds which are also distinct from the pairs of transmit voltage sources and grounds as described above. Thus, the pre-amplifier stage 140 of each receive channel is driven from a third off-chip voltage source and ground that are coupled to the integrated circuit 100 via $VDD_{RA}$ 145 and $GND_{RA}$ 146. Likewise, the post-amplifier/output stage 141 of each receive channel is driven from a fourth off-chip voltage source and ground that are coupled to the integrated circuit 100 via $VDD_{RB}$ 147 and $GND_{RB}$ 148. Therefore, as can be seen in FIG. 1, there are two separate power and ground pads and traces in the receive region 101 on each side of the block diagram. Thus, there are four distinct voltage sources used to power various components of the integrated circuit 100 in order to reduce the effects of noise and crosstalk.

An additional measure taken to reduce the effects of noise and crosstalk is placing conventional ground rings around each component, such as substrate taps (guard rings) 150 around the drive stage 121 of the transmit channels 110. Furthermore, conventional guard rings may also be placed around each transmit and receive channel, such as guard ring 151 around the Nth receive channel 132.

Yet another measure taken to reduce the effects of noise and crosstalk is the use of the spatial separation region 103. A top view of the spatial separation region 103 is shown with respect to FIG. 2 according to an embodiment of the invention The spatial separation region 103 is itself divided by a small center region 200. The center region 200 comprises undoped substrate that serves as a barrier such that no power traces cross. Above the center region 200 is a transmit side 201 of the spatial separation region and below the center region 200 is a receive side 202 of the spatial separation region 103.

Each side 201 and 202 is characterized by a series of horizontal p-type and n-type semiconductor regions 210. An n-type semiconductor region is an area of silicon that is highly doped (impurities added) such that the resistivity of this area is low and there are additional free negative charge carriers. Likewise, a p-type semiconductor region is also an area of silicon that is highly doped such that there are additional free positive charge carriers. These regions 210 alternate from p-type to n-type throughout each side 201 and 202 of the spatial separation region 103. A gap, or semiconductor region that is undoped, may or may not be present between each horizontal p-type and n-type semiconductor region 210. Furthermore, the spatial separation region 103 is typically more effective if the two horizontal semiconductor regions 210 that are closest to the center region 200, i.e., the first horizontal region on the transmitter side 201 and the first horizontal region 210 on the receiver side 202, are p-type semiconductor regions.

Additionally, each side 201 and 202 is further characterized by rails 212 that comprise portions of one of the metal layers that form the semiconductor chip. These rails 212, which run perpendicular to the horizontal semiconductor regions 210, are used to connect a voltage source or ground to the p-type and n-type semiconductor regions 210. Horizontal metal connectors (not shown), which are disposed directly over the top of each semiconductor region 210, are used to distribute voltage or ground connections from the rails 212 to the p-type and n-type semiconductor regions 210.

By reverse biasing the p-type and n-type semiconductor regions 210 in the spatial separation region 103, the effects of noise and crosstalk from the transmit region 101 to the receive region 102 can be further reduced. This is accomplished by "tapping", i.e., providing a connection between a p/n-type region 210 and a rail 212 in a specific pattern so as to create several reverse-biased areas that disrupt current flow which may couple noise and crosstalk between the receive and transmit halves of the chip. These taps effectively form reverse biased diodes that are parallel to the center region 200 between the transmit region 101 and the receive region 102 of the integrated circuit 100. Thus, stray carriers caused by noise and crosstalk are far more likely to be attracted to the reverse-biased pn-junctions before traversing the width of the spatial separation region 103.

In one embodiment, the p-type regions 250 on the receiver side 202 of the spatial separation region 200 are connected to the rails 251 that are connected to a ground. Typically, the ground is one of the grounds supplying components in the receiver region 102, such as $GND_{RA}$ 146. These connections are denoted by the coupling vias 252. Further, the n-type regions 253 on the receiver side 202 of the spatial separation region 200 are connected to the rails 254 that are connected to a voltage source. Typically, the voltage source is one of the voltage sources connected to components in the receiver region 102, such as $VDD_{RA}$ 145. These connections are denoted by the coupling vias 255 shown in FIG. 2. By providing connections as described above, the junctions between the p-type regions 250 and the n-type regions 253 are reverse biased such that noise and crosstalk are disrupted across this part of the spatial separation region 200.

In a similar way, on the transmit side 201 of the spatial separation region 200, the p-type regions 263 are connected to the rails 261 that are connected to a ground. Typically, the ground is one of the grounds connected to components in the transmit region 101, such as $GND_{TA}$ 126. These connections are denoted by the coupling vias 262. Further, the n-type regions 260 on the transmit side 201 of the spatial separation region 200 are connected to the rails 264 that are connected to a voltage source. Typically, the voltage source is one of the voltage sources supplying components in the transmit region 101, such as $VDD_{TA}$ 125. These connections are denoted by the coupling vias 265. Again, by providing connections as described above, the p-type regions 263 and the n-type regions 260 are reverse biased such that noise and crosstalk are disrupted across this part of the spatial separation region 200.

Figure 3:
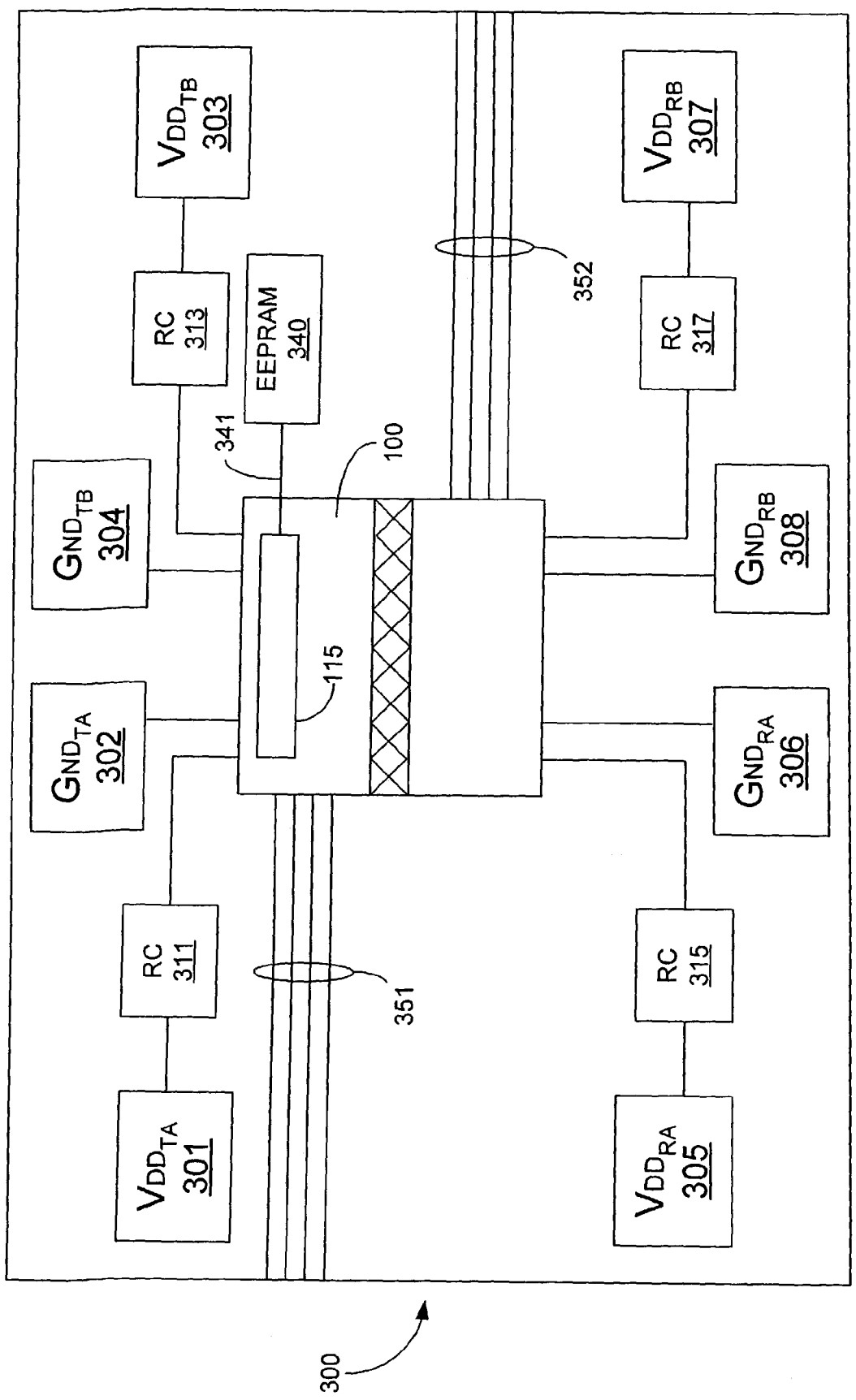
FIG. 3 is a block diagram of a fiber-optic communication module that incorporates the integrated circuit of FIG. 1 in accordance with an embodiment of the invention.

FIG. 3 is a block diagram of a fiber-optic communication module 300 that incorporates the integrated circuit 100 of FIG. 1 in accordance with an embodiment of the invention. The module 300 houses several of the above-mentioned off-chip components. For example, the power supply $VDD_{TA}$ 301 and $GND_{TA}$ 302 are coupled to the pads for $VDD_{TA}$ 125 and $GND_{TA}$ 126 of the integrated circuit 100. Similarly, $VDD_{TB}$ 303 and $GND_{TB}$ 304, $VDD_{RA}$ 305 and $GND_{RA}$ 306, and $VDD_{RB}$ 307 and $GND_{RB}$ 308 are also coupled to the respective pads for the corresponding internal power and ground traces of the integrated circuit 100. Each voltage supply typically is nominally rated at 3.3 Volts and the four grounds may or may not be grounded to the same ground plane. In addition, the actual voltage supplies 301, 303, 305, and 307 are spaced from one another so as to further reduce any inductive or capacitive coupling between the supply or ground lines.

Additionally, another technique is used to reduce the effects of noise and crosstalk on the sensitive portions of the integrated circuit 100. Each voltage supply 301, 303, 305, and 307 has an associated respective bypass filter 311, 313, 115, and 317. In the embodiment shown in FIG. 3, each bypass filter comprises an RC circuit having a capacitor and a resistor (neither shown) in series shunting the power supply and ground. The capacitor in one embodiment is 100 nF and the resistor in one embodiment is 10 ohms. In another embodiment not shown, each capacitor is disposed on the integrated circuit 100 and a series resistor is coupled between the capacitor and the bond wire that connects the integrated circuit 100 power pad to each respective voltage supply. The resistor reduces ringing of the RLC circuits formed by the bond wires and the bypass capacitors.

The module 300 also comprises input signal paths 351 and output signal paths 352. The configuration of the module is not limited to the arrangement of FIG. 3 and can be arranged in any suitable fashion to interface with other communication devices. One such configuration of the module 300 is suitable to interface with a communication device using a 9×9 Ball Grid Array footprint.

Another component disposed in the module 300 is an EEPROM chip 340 that is typically used to store performance parameters of the integrated circuit and other digital information. The EEPROM chip 340 is coupled to the digital logic block 115 of the integrated circuit 100 in one embodiment through a standard serial I/O connection 341. The digital logic block 115 communicates with various components of the integrated circuit through an 8-bit digital bus 116 (FIG. 1). Digital communication and logic are well known in the art, thus the following features that may be incorporated in the module 300 are briefly described herein. A more detailed description of each of these features is described in U.S. patent application Ser. No. 09/735,315 filed on Dec. 12, 2000, and assigned to the Agilent Technologies Corporation, located in Palo Alto, Calif., and is incorporated by reference.

One feature that the digital logic block 115 provides is that it includes a state machine (not shown) that is operable to load operating parameters for both the receiver channels and transmitter channels from the EEPROM chip 340. The EEPROM is typically programmed by the manufacturer, and upon initialization of the integrated circuit 100, the state machine downloads the parameters from the EEPROM chip 340 into internal RAM registers (not shown) on the integrated circuit 100. However, although the end-user typically does not reprogram the EEPROM 340, the manufacturer may provide access to allow the end-user to reprogram the EEPROM chip 340. Furthermore, the end user may be allowed to read and write these RAM registers on the integrated circuit 100 via the serial I/O interface 341 that is part of the integrated circuit 100.

Another feature included in the digital logic block 115 is a counter (not shown) that continuously updates a register that holds the total power-on hours of the integrated circuit 100, i.e., how many hours the chip has operated. To prevent accidental loss of this data, the data is stored in a triple redundant fashion, i.e., in three registers (not shown). Therefore, if a user is reading the register or accidentally writes one of the registers, the other registers will store the correct value. At power-up, when the power-on hours may be retrieved for purposes discussed below, a circuit implements a conventional voting function to determine the value that the majority of registers are holding, and accepts this value as the power-on hours value. The power-on hours value can be used simply to determine the operating age of the integrated circuit 100, or is more typically used to adjust the operating parameters of the circuit or the laser, which may be external to the integrated circuit 100. For example, as the laser ages, its current to light transfer curve may shift, and thus one can adjust the drive current to maintain the desired optical power out.

Another feature connected to the digital logic block 115 is a power-on reset which, like conventional power-on resets, generates a reset pulse to hold the integrated circuit 100 in a reset state until one or more of the VDD values exceeds a predetermined threshold.

The digital logic block 115 further receives an input from an on-chip temperature sensor (not shown). This temperature sensor comprises an analog output that is connected to an analog-to-digital converter (not shown) to convert the analog voltage from the temperature sensor into a digital value that can be sent to the digital logic block 115. The digital value is stored in memory and monitored periodically by the digital logic block 115 and can be used to change the characteristics of either the receiver channels or the transmitter channels based on the temperature. For example, one can compare the temperature to a maximum temperature and/or a minimum temperature and if the actual temperature is above the maximum temperature or below the minimum temperature, the digital logic block 115 can set a bit that will shut down a laser driver 121 (FIG. 1). Alternatively, the digital logic block 115 can just set a fault bit that one can monitor externally through the serial bus 341 to detect any type of over or under temperature condition. This temperature information can also be used to adjust the driving characteristics of the laser. Although the temperature sensor measures the temperature of the chip itself, and not the laser, the laser and chip are close enough together that the temperature of the chip gives a good indication of the temperature of the laser, and is typically within 5° (or 10°) C. of the temperature of the laser.

Similarly, there can be an internal (to the integrated circuit 100) sense resistor (not shown) in series with the laser. The integrated circuit 100 monitors the voltage across the resistor to measure the current through the laser (not shown) and to set a fault bit if there is an over current condition or to automatically shut down the corresponding laser driver 121 if there is an over current condition.

The digital logic block 115 may further include error detection (typically using parity), which detects any errors in the data that is downloaded from the EEPROM chip 340. If the error-detection circuit detects a data error, it sets a flag and can prevent the corresponding laser (not shown) from operating. This prevents an erroneous value, such as for the laser drive signal, from being set to a level that could cause damage to the laser or injury to an operator.

The digital logic block 115 may also include an input from a receiver input-signal detector. In one type of signal detector, circuitry compares the peak and average of the input signal (on pads 142 of FIG. 1) to generate an amplitude value and compares the amplitude to a threshold. If the amplitude is less than the threshold, then it is determined that no signal is being input to the receiver. In conventional circuits, the detector would put a logic detect/no-detect signal directly on an external pin of the receiver chip, which external circuitry could monitor. However, because this multi-channel transmitter/receiver has a serial interface for the digital circuitry, the signal-detector may connect to the digital logic block 115 which sets a bit in a register (not shown) that is read by external circuitry via the serial interface 341. This eliminates the need for additional pins on the integrated circuit 100.

Figure 4:
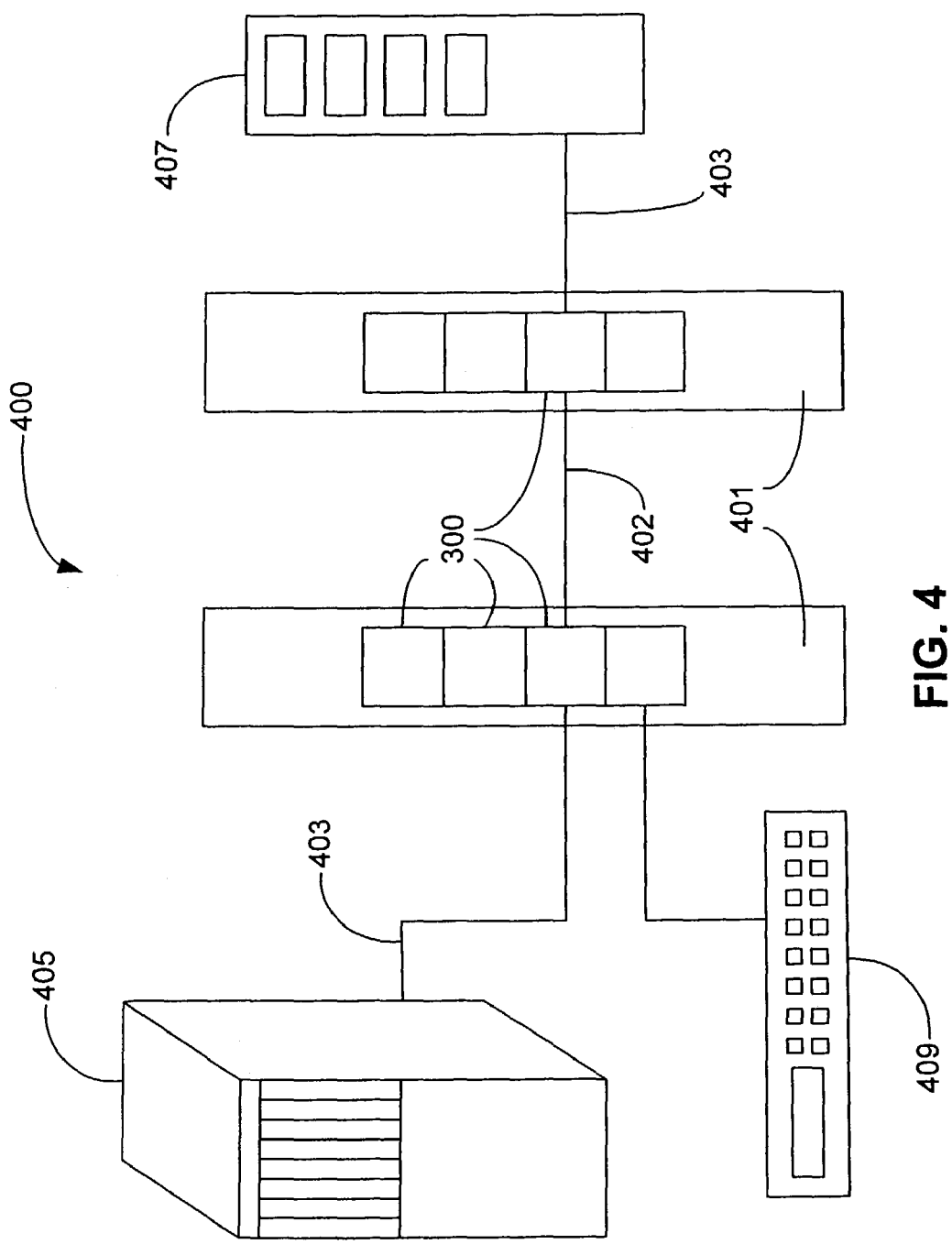
FIG. 4 is a block diagram of a digital communication system that incorporates the fiber-optic module of FIG. 3 in accordance with an embodiment of the invention.

FIG. 4 is a block diagram of a digital communication system 400 that incorporates the fiber-optic module 300 of FIG. 3 in accordance with an embodiment of the invention. The system 400 comprises devices operable to communicate digitally with each other. Such devices include high-volume database computers 405, server computers 407, and network devices 409 (hubs, routers, switches). A conventional TX/RX link 403 couples the devices to a communication hub 401 that is operable to house several fiber-optic modules 300.

In this application, the module 300 is designed to perform optimally at data rates of approximately 1 to 3.2 gigabits per second (Gb/s), at distances of 300 meters or less. The module 300 is a high performance fiber-optic module for parallel optical data communication applications. The fiber-optic module 300 incorporates eight independent data channels (four transmit and four receive channels) operating from 1 to 3.2 Gb/s per channel for digital communication between devices. The module 300 can then communicate with other modules through a fiber-optic communication link 402. As such, devices such as high-volume database computers 405, server computers 407, and network devices 409 (hubs, routers, switches) can communicate efficiently and effectively using the multichannel capabilities of the fiber-optic module 300.

We claim:

1. An integrated circuit cast on a single die, comprising:
a plurality of receivers in a receiver region;
a plurality of transmitters in a transmitter region; and
a spatial separation region having a plurality of n-type and p-type subregions and operable to electrically isolate the transmitter region from the receiver region, wherein the plurality of p-type and n-type semiconductor regions are disposed on the single die in alternating horizontal rows.

2. The integrated circuit of claim 1, the plurality of receivers each comprise:
an amplifier operable to amplify a signal from a photo detector;
a buffer coupled to the amplifier and operable to process the amplified signal; and
an electrical driver coupled to the buffer and operable to drive the processed signal.

3. The integrated circuit of claim 2 wherein the amplifier is coupled to a first voltage supply and a first ground and the buffer and electrical driver are coupled to a second voltage supply and a second ground.

4. The integrated circuit of claim 1 wherein the plurality of transmitters each comprise:
a driver operable to generate an analog signal for driving a light emitting source; and
a buffer coupled to an input node of driver.

5. The integrated circuit of claim 4 wherein the light emitting source driver is coupled to a first voltage supply and a first ground and the buffer is coupled to a second voltage supply and a second ground.

6. The integrated circuit of claim 4 wherein the light-emitting source comprises a laser.

7. The integrated circuit of claim 4 wherein the light-emitting source comprises a light-emitting diode.

8. The integrated circuit of claim 1, further comprising undoped semiconductor regions respectively disposed between the plurality of p-type and n-type semiconductor regions.

9. The integrated circuit of claim 1 wherein the spatial separation region further comprises an undoped center region that is not a p-type or n-type semiconductor region disposed substantially equidistant from the transmitter region and the receiver region.

10. The integrated circuit of claim 9 wherein the horizontal row semiconductor region contiguous to the center region in the transmitter region is a p-type semiconductor region.

11. The integrated circuit of claim 9 wherein the horizontal row semiconductor region contiguous to the center region in the receiver region is a p-type semiconductor region.

12. The integrated circuit of claim 1 wherein the plurality of p-type subregions are biased to a ground node.

13. The integrated circuit of claim 12, wherein the ground node is coupled only to components in the transmitter region.

14. The integrated circuit of claim 12, wherein the ground is coupled only to components in the receiver region.

15. The integrated circuit of claim 1 wherein the plurality of n-type subregions are biased to a voltage supply node.

16. The integrated circuit of claim 15, wherein the voltage supply node is coupled only to components in the transmitter region.

17. The integrated circuit of claim 15, wherein the voltage supply node is coupled only to components in the receiver region.

18. The integrated circuit of claim 1, further comprising respective guard rings surrounding each transmitter and each receiver.

19. An integrated circuit cast on a single die, comprising:
a plurality of receivers in a receiver region;
a plurality of transmitters in a transmitter region; and
a spatial separation region having a plurality of n-type and p-type subregions and operable to electrically isolate the transmitter region from the receiver region, wherein the plurality of n-type and p-type semiconductor subregions are configured in alternating horizontal rows.

20. The integrated circuit of claim 19 wherein the transmitting region comprises four transmitters.

21. The integrated circuit of claim 19 wherein the receiving region comprises four receivers.

22. The integrated circuit of claim 19 wherein the plurality of transmitters are coupled to a first voltage source and a first ground and the plurality of receivers are coupled to a second voltage source and a second ground.

23. The integrated circuit of claim 19, further comprising a digital circuit coupled to each receiver and transmitter.

24. The integrated circuit of claim 23 wherein the digital circuit is operable to store operating parameters for the plurality of transmitters and for the plurality of receivers, the digital circuit operable to download the operating parameters when the integrated circuit is initialized.

25. The integrated circuit of claim 23 wherein the digital circuit is operable to count track the amount of time that the integrated circuit is operating.

26. The integrated circuit of claim 23 wherein the digital circuit is operable to generate a power-on-reset signal when the integrated circuit is initialized, the power-on-reset signal disabling the plurality of transmitters and receivers until a voltage source exceeds a predetermined threshold.

27. The integrated circuit of claim 23 wherein the digital circuit is operable to detect and digitally store a temperature of the integrated circuit and to alter the performance of the plurality of transmitters and receivers in response to the temperature.

28. The integrated circuit of claim 23 wherein the digital circuit is operable to detect the current through each of the plurality of transmitters and to disable to the transmitter if the respective current exceeds a predetermined threshold.

29. The integrated circuit of claim 23 wherein the digital circuit is operable to detect errors in data that is received from an external source.

30. The integrated circuit of claim 23 wherein the digital circuit is operable to detect whether a signal is being received by one of the plurality of receivers.

31. The integrated circuit of claim 23 wherein the digital circuit is operable to detect the power output of each of the plurality of transmitters and to disable a transmitter if the respective power output exceeds a predetermined threshold.

32. The communication module comprising:
a transceiver chip cast on a single die including;
a plurality of receivers in a receiver region;
a plurality of transmitters in a transmitter region;
an isolation region having a plurality of n-type and p-type subregions and operable to electrically isolate the transmitter region from the receiver region;
a first receiver voltage source and first receiver ground coupled to each amplifier of each receiver;
a second receiver voltage source and second receiver ground coupled to each buffer and electrical driver of each receiver;
a first transmitter voltage source and first transmitter ground coupled to each laser driver of each transmitter;
a second transmitter voltage source and second transmitter ground coupled to each buffer of each transmitter; and
a supply bypass filter disposed in the module between each voltage source and the transceiver chip.

33. The communication module of claim 32 wherein each bypass filter is disposed on the transceiver chip.

* * * * *